United States Patent [19]

Petzold

[11] Patent Number: 5,144,265

[45] Date of Patent: Sep. 1, 1992

[54] PULSE WIDTH MODULATION TECHNIQUE

[75] Inventor: Werner P. Petzold, Harwood Heights, Ill.

[73] Assignee: Borg-Warner Automotive, Inc., Sterling Heights, Mich.

[21] Appl. No.: 803,173

[22] Filed: Dec. 5, 1991

Related U.S. Application Data

[62] Division of Ser. No. 555,715, Jul. 19, 1990.

[51] Int. Cl.$^5$ .............................................. H03K 7/08
[52] U.S. Cl. ................................... 332/109; 307/265; 375/22
[58] Field of Search ........................ 332/109, 110, 111; 375/22; 307/265

[56] References Cited

U.S. PATENT DOCUMENTS

| 4,001,728 | 1/1977 | Schneider | 332/109 X |
| 4,675,546 | 6/1987 | Shaw | 307/265 |
| 5,086,280 | 2/1992 | Ohmura et al. | 307/265 X |

Primary Examiner—Siegfried H. Grimm
Attorney, Agent, or Firm—Willian Brinks Olds Hofer Gilson & Lione

[57] ABSTRACT

Improved pulse width modulation technique provides for an increased sampling rate without an increased ON/OFF rate at associated control devices. Both ON/OFF and OFF/ON edges in a PWM signal are modulated. The system then samples at twice the pulse turn-on rate to provide more frequent sampling. System response time may be decreased without an increase in the operating frequency for the associated control device. Particular application of the present invention may be found in continuously variable transmission systems which utilize PWM-controlled electrohydraulic valves for ratio control, line pressure control and clutch control. A system for implementing the PWM signal has a duty-cycle calculator coupled with timing circuits to control input data reading functions and circuit enabling, leading edge and trailing edge regulators and an output pulse generator.

5 Claims, 4 Drawing Sheets

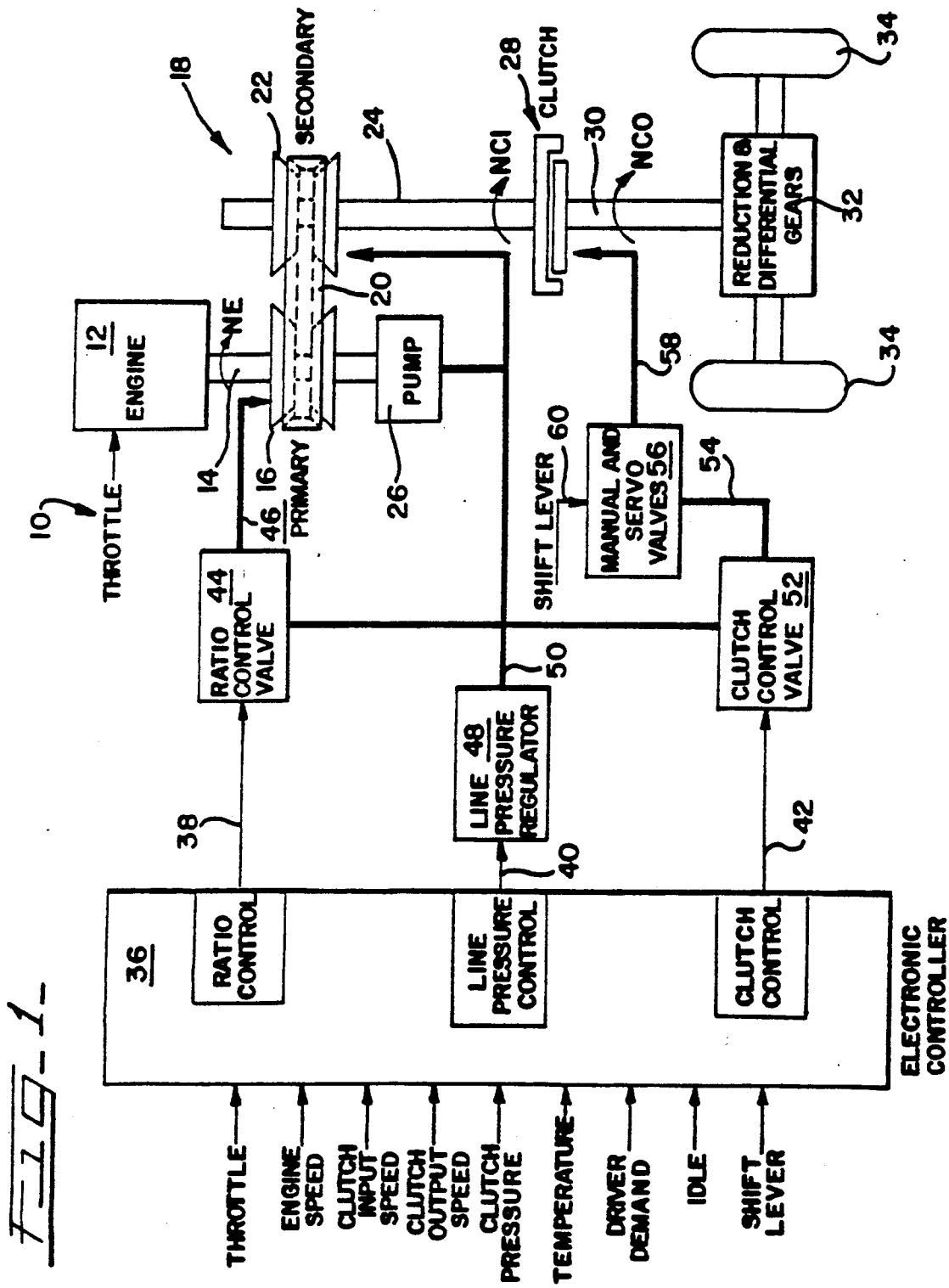

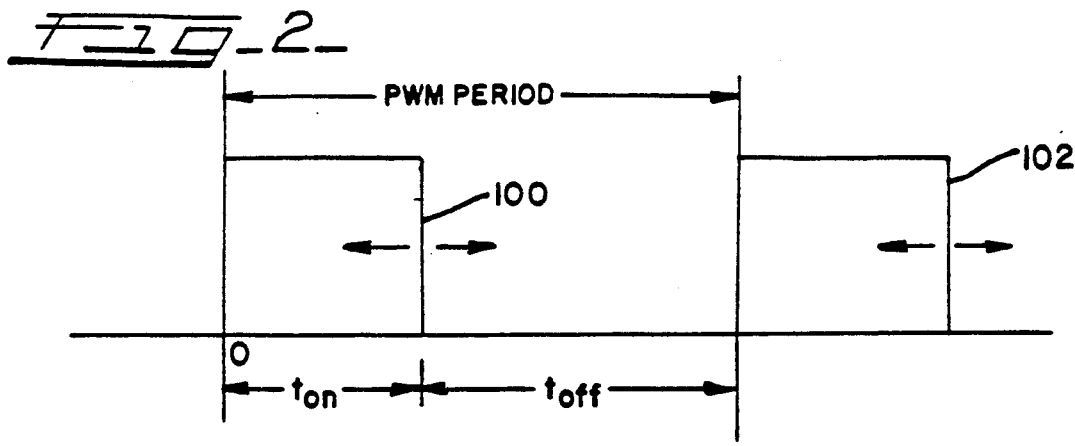
FIG-2-
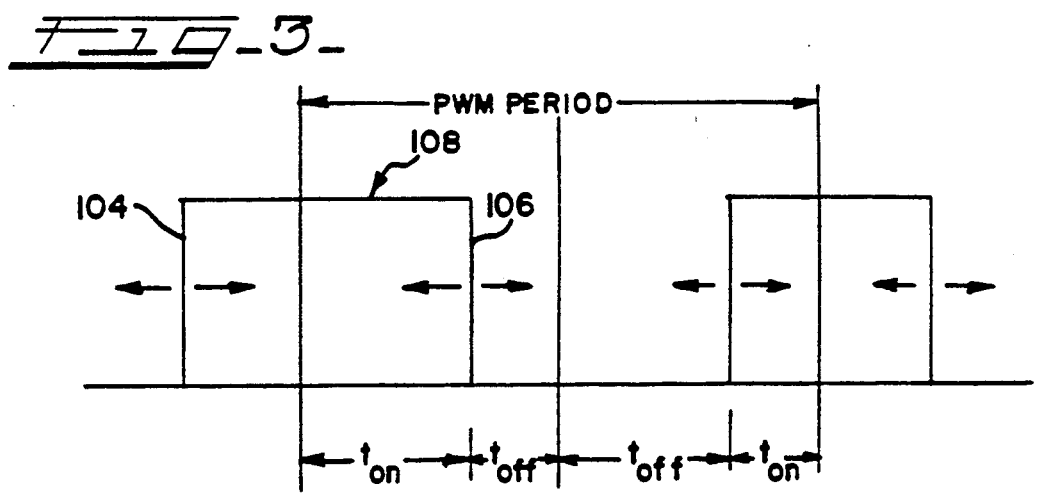
FIG-3-
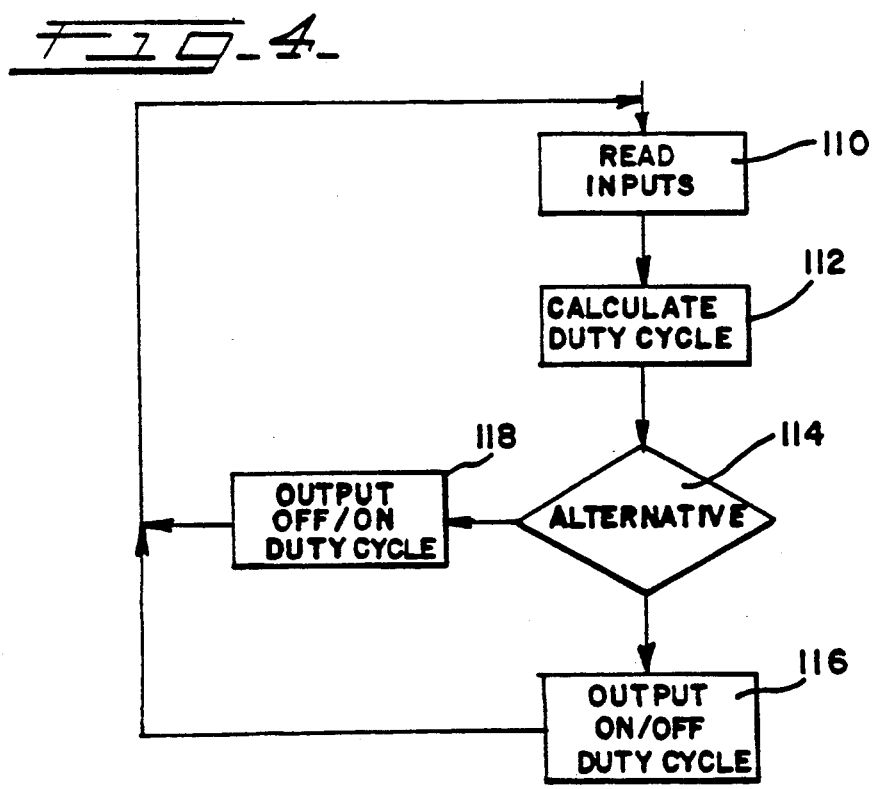
FIG-4-

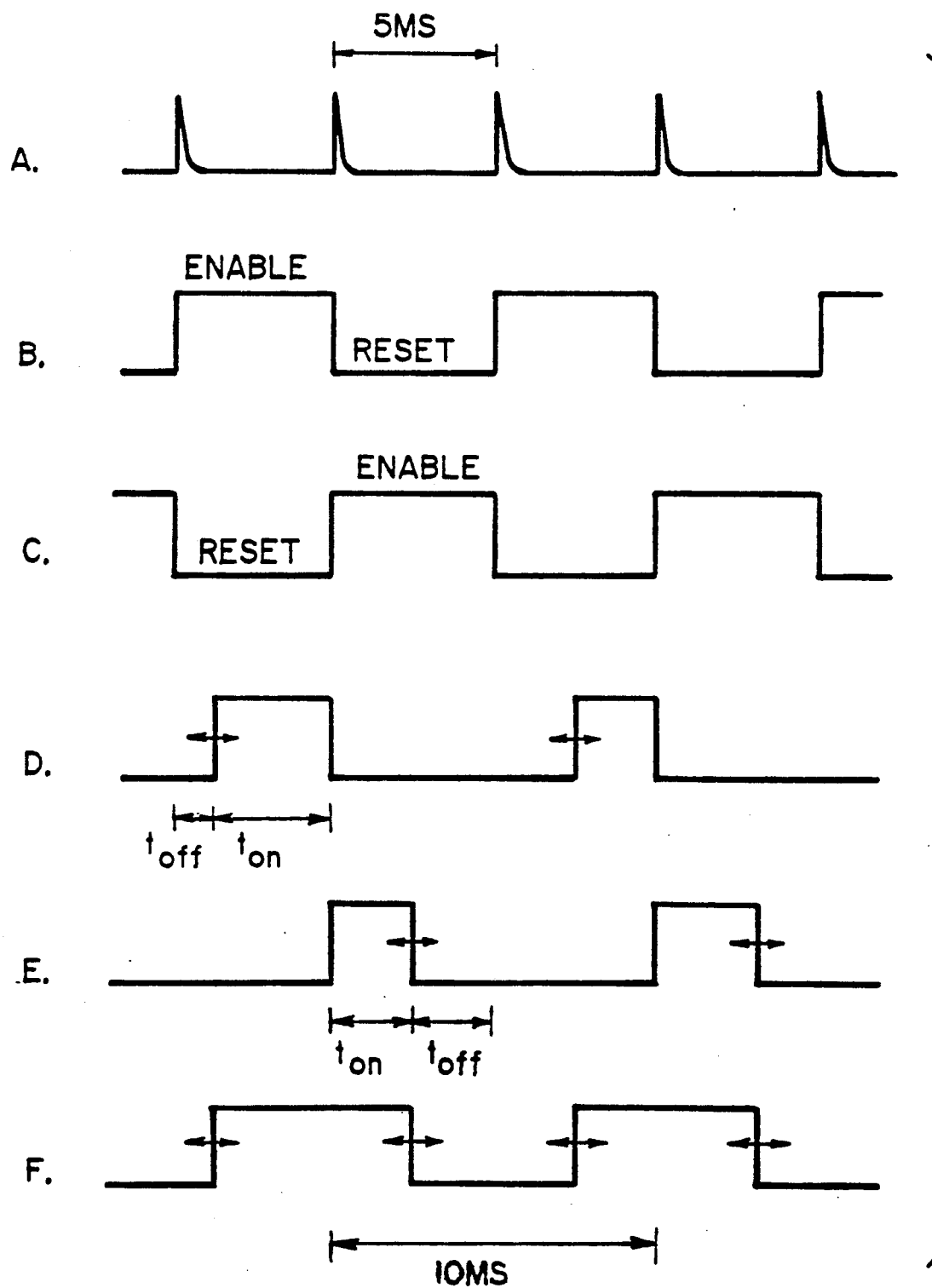
FIG_6_

PULSE WIDTH MODULATION TECHNIQUE

This is a division of application Ser. No. 07/555,715, filed Jul. 19,1990.

BACKGROUND OF THE INVENTION

The present invention generally relates to the control system art. More particularly, the present invention relates to the provision of signals for control purposes, and especially to providing double edge modulated pulse signals for control purposes in a continuously variable transmission system and system apparatus for implementing this improved technique.

Various applications and constructions for continuously variable transmission systems are set forth in the following related, copending applications filed on Mar. 13, 1987 herewith: "Temperature Compensation Technique for a Continuously Variable Transmission Control System," Ser. No. 25,392; "Ratio Control Technique for Continuously Variable Transmission Systems," Ser. No. 25,389, now U.S. Pat. No. 4,793,454; "Continuously Variable Transmission Clutch Control System," Ser. No. 25,391, now U.S. Pat. No. 4,811,225; and "Special Start Technique for Continuously Variable Transmission Clutch Control," Ser. No. 25,476. The teachings of the above identified applications are incorporated herein by reference.

Additional examples of the operation and construction of continuously variable transmissions (CVT's), may be found in U.S. Pat. No. 4,522,086, entitled "Control System for Continuously Variable Transmission" and U.S. Pat. No. 4,458,318, entitled "Control Arrangement for a Variable Pulley Transmission." All of the above identified applications and patents are assigned to the assignee of the present application.

The operation and construction of hydraulic control systems for use in CVT's are shown generally by U.S. Pat. No. 3,115,049—Moan—and U.S. Pat. No. 4,152,947—Van Deursen et al. Other still pending applications and U.S. patents provide additional improvements in the continual variable transmission art including, "Hydraulic Control System for Continuously Variable Transmission," Ser. No. 421,198, filed Sep. 22, 1982, which issued Dec. 15, 1987 as U.S. Pat. No. 4,712,453; "Hydraulic Control System for Continuously Variable Transmission," Ser. No. 717,913, filed Mar. 29, 1985; which issued Jan. 12, 1988 as U.S. Pat. No. 4,718,308; and "Clutch Control System for a Continuously Variable Transmission," U.S. Pat. No. 4,648,496, issued Mar. 10, 1987.

Those applications and patents described above which are not specifically incorporated by reference are hereby incorporated to the extent they deal with a control system regulated by means of a pulse width modulated signal.

Due to the use of control valves and the nature of the hydraulic systems utilized for various control applications in the above identified patents and applications, the operation frequency for any pulse width modulated signal utilized therein may be unduly limited. For example, in the various CVT applications mentioned above, it has been found that a pulse width modulation signal may not have an operation frequency greater than about 100 Hz because of the physical constraints of the electro-hydraulic valve system in use. It is envisioned that other control systems outside of the continuously variable transmission art may likewise share similar physical constraints. However, it may be desirable, particularly from a system response speed viewpoint, to provide an update to a digital implementation of a PWM control signal more frequently than the frequency limited by their physical constraints.

BRIEF SUMMARY OF THE INVENTION

Accordingly, a principal object of the present invention lies in providing an improved pulse width modulation signal technique which generally overcomes the deficiencies of the prior art.

A more specific object of the present invention lies in the provision of a double edge (ON/OFF, OFF/ON) pulse width modulation technique for use in continuously variable transmission and other systems.

Generally, the present invention provides a technique for increasing a digital control system sample rate and thereby improving system response without increasing the system modulation rate. The system of the present invention effectively provides update information twice per pulse modulation cycle. The updated information alternately controls the OFF/ON pulse time and the ON/OFF pulse time. Through the use of this alternate modulation technique, both the leading and trailing edges of the modulating pulse may be time varied to provide a desired duty cycle for control in the particular control system application.

The method of the present invention may also be employed in a variety of physical systems. A preferred application utilizes a controller stage for responding to a twice-per-PWM-period clock signal to read selected inputs and calculate an appropriate duty cycle for each one-half period in the PWM signal. In response to the output of the controller, alternately enabled leading edge and trailing edge regulators drive a PWM pulse generator to provide the desired PWM signal. A toggling flip/flop circuit may provide the enabling action for the edge regulator.

Additional and further objects and advantages of the present invention will become apparent from the following detailed description and accompanying drawings.

BRIEF DESCRIPTION OF THE FIGURES

The novel features of the present invention are set forth with particularity in the appended claims. The invention, together with the objects and advantages thereof, may be understood more fully by reference to the following detailed description taken in conjunction with the accompanying drawings in which like reference numerals are used to indicate like elements and of which:

FIG. 1 is a block diagram representation of a continuously variable transmission system;

FIG. 2 is an illustration of a standard pulse width modulated control signal for use in systems such as that of FIG. 1;

FIG. 3 is an exemplary waveform representation of a double edge modulated control signal for use in accordance with the present invention; and FIG. 4 is a flow chart illustrating the operation of a control system for use of a double edge pulse width modulated signal of the present invention.

FIG. 6 is a set of exemplary waveform representations of a double edge modulated control signals produced by the circuit of FIGURE 5.

DESCRIPTION OF A PREFERRED EMBODIMENT

Figure 5:
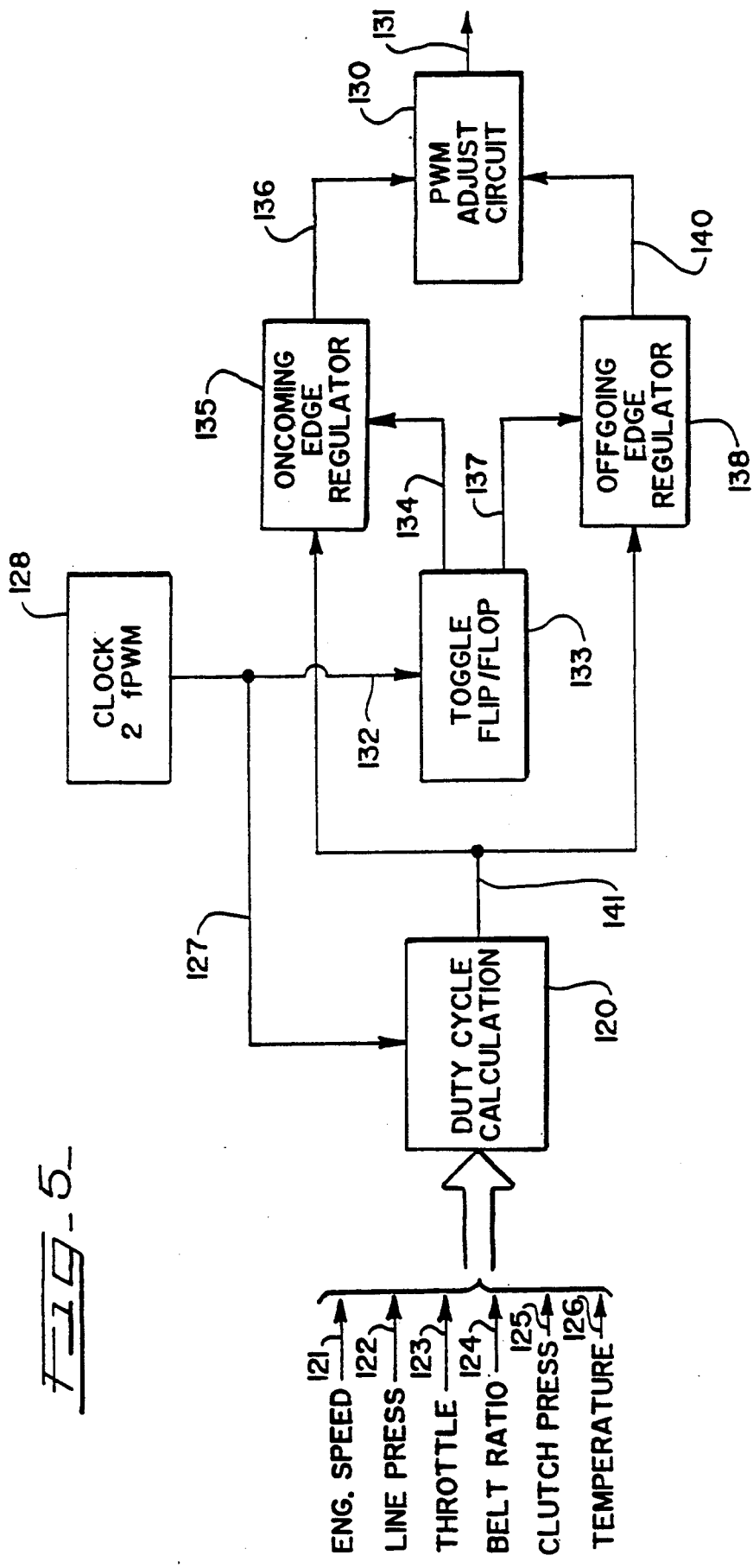
FIG. 5 depicts one circuit for implementing the method steps set out in the flow chart of FIG. 4.

As shown in FIG. 1, a throttle signal 10 controls the operation of an engine 12 which transmits torque via a shaft 14 to a primary pulley 16 in a CVT 18. In a typical embodiment, a flywheel and damping arrangement may be included on the shaft 14 between the engine 12 and the primary pulley 16. An elastomeric or metal belt 20 connects the primary pulley 16 to a secondary pulley 22 to transmit torque to a second shaft 24. A pump 26 may also be driven by the first shaft 14 to provide line pressure for the hydraulic system and the controls of the CVT 18.

The second shaft 24 drives the input to a clutch 28 which in turn provides a torque to a third shaft 30. The third shaft 30 drives a reduction differential gear arrangement 32 as a drive line to provide power to the vehicle wheels 34.

In operation, an electronic controller 36 receives a multiplicity of inputs including throttle, engine speed, clutch input speed, clutch output speed, clutch pressure, temperature, driver demand, idle, shift lever and other information input signals as shown at the left of FIG. 1. The electronic controller 36 operates in a logical fashion to provide a ratio control signal on a line 38, a line pressure control signal on a line 40 and a clutch control signal on a line 42. The signal on the line 38 to a ratio control valve 44 controls the hydraulic pressure on a line 46 to the primary pulley 16 of the CVT 18 to control the ratio between the primary pulley 16 and the secondary pulley 22, i.e., the belt ratio. The signal on the line 40 communicates with a line pressure regulator 48 which via a line 50 provides line pressure from fluid flow of pump 26 to the ratio control valve 44 and a clutch control valve 52. The output of the line pressure regulator on the line 50 also controls the pressure at the secondary pulley 22 to ensure that the belt 20 does not slip. The output signal on the line 42 to the clutch control valve 52 controls the output of the clutch control valve 52 on a line 54 to the manual and servo valves 56 which controls the fluid flow on the line 58 to the clutch 28. This is the signal which controls or which provides the pressure at the clutch 28 and hence regulates the torque transfer between the second shaft 24 and the third shaft 30.

A shift lever signal on a line 60 provides an additional control of the manual and servo valves 56. When the shift lever signal on the line 60 indicates that the vehicle is in a neutral or park mode, the manual control within the valve arrangement 56 is closed. This prevents fluid from flowing to the clutch 28 and thus prevents any torque transfer through the clutch 28 when the vehicle is in the neutral or park mode.

A first arrow NE (N=speed; E=engine) on the first shaft 14 indicates one acceptable point of measurement for engine speed. A second arrow NCI (CI=clutch input) on the second shaft 24 indicates an acceptable point of measurement for the clutch input speed. A third arrow NCO (CO=clutch output) indicates an acceptable point of measurement for the clutch output speed, which corresponds to vehicle speed. Those skilled in the art will recognize that the various speed values may be accurately obtained at other locations as desired.

The ratio of NE to NCI will correspond to and provide a measure of the transmission belt ratio. The difference between NCI and NCO correspondingly provides a measure of the slippage at the clutch 28. When NCI equals NCO, the clutch 28 should be locked-up with no slippage.

The electronic controller 36 implements the control functions for controlling the hydraulic fluid flow to the primary sheave actuator 16 by means of a pulse width modulation (PWM)-operated electrohydraulic control valve 44. The pressure from this flow moves the primary actuator which forces the belt to move in the primary and secondary pulleys. Movement of the belt creates a ratio change in the CVT.

Also, the line pressure regulator 48 regulates the line pressure in line 50 by means of a pulse width modulation (PWM)-operated electrohydraulic control discussed in more detail in the related copending applications. Likewise, clutch control valve 52 comprises in part a pulse width modulation (PWM)-operated electrohydraulic control valve.

It has been found in application of systems such as that of FIG. 1 that the PWM signal used to control the various electrohydraulic valves may not exceed approximately 100 Hz due to the response time of the valves themselves. The electrohydraulic valve response degrades substantially as the frequency is increased above 100 Hz.

However, it is desirable to update the system and generate a duty cycle responsive to the sensed update characteristics to provide desired control more frequently than at a 100 Hz frequency.

Referring now to FIG. 2, therein is shown a typical pulse width modulation signal for use in the control system of FIG. 1 or other control systems. As shown therein, a first pulse 100 begins at a time "0" and terminates a period $t_{ON}$ later. The remaining portion of the PWM period represents a non-pulse interval illustrated as $t_{OFF}$. At the conclusion of a PWM period, a second pulse 102 begins and endures for a set time. The termination of the pulse 100 or the pulse 102 may be varied, or modulated, as desired. Variation in the length of the pulse within the PWM period provides a duty cycle given as a percent ratio of $t_{ON}$ to $T_P$, the PWM period. However, in FIG. 2 the leading edge of the pulse in any PWM period coincides with the initiation of the PWM period itself.

As mentioned above, the pulse width modulation frequency in control systems for the continuously variable transmission of the preferred embodiment is limited to approximately 100 Hz. Accordingly, the PWM period illustrated in FIG. 2 would be approximately 10 ms.

Referring now to FIG. 3, therein is shown an exemplary waveform illustrative of the double edge modulation for a pulse width modulation control signal in accordance with the present invention. As shown in FIG. 3, the PWM period has remained constant from that of the traditional PWM signal illustrated in FIG. 2. However, the update or sampling period has been cut in half which corresponds to a doubling in update frequency. This may be accomplished as shown by modulation of both the leading edge 104 and the trailing edge 106 of a control pulse 108. The duty cycle for each pulse is now calculated as a function of the $t_{ON}$ for each half period of the PWM signal.

Referring now to FIG. 4, therein is shown a flow chart for operation of a control system according to the double edge modulation technique of the present invention. The system operation begins at a block 110 at which the system reads the input signals. Based upon the input signals read at the block 110, the system then calculates the appropriate duty cycle at a block 112. The system then advances to a decision block 114 at which it alternates between a first output duty cycle block 116 which controls the ON to OFF pulse edge and a second output duty cycle block 118 which controls the OFF to ON pulse edge. The system then loops back to read the inputs again. Thus, if this system loop is accomplished in 5 ms., a pulse width modulation cycle of 10 ms. will be achieved. However, the duty cycle information will be updated twice per pulse modulation period rather than once per period as with the traditional modulation signal illustrated in FIG. 2.

FIG. 5 depicts one, exemplary circuit for implementing the method steps set out in the flow chart of FIG. 4. As shown in FIG. 5, controller stage 120 receives data including a plurality of input signals over lines 121-126. any desired number of input signals can be used to determine the controller output. These input signals, of course, represent the information that is to determine the "information" content of the PWM signal. In the illustrated embodiment, these signals, Engine Speed, Line Pressure, Throttle, Belt Ratio, Clutch Pressure and Temperature, represent information that is desired to control the operation of the clutch control valve in a CVT system using PWM control signals. Controller stage 120 provides the resultant data as an output on line 141 when stimulated by a "read" signal on line 127 from oscillator 128.

The oscillator 128 provides a clock whose period is one-half the period of the PWM period. The output from oscillator 128 provides the "read" signal on line 127 for the controller stage as well as the gating signal on line 132 for the flip/flop or multivibrator stage 133. Because it has one-half the period, the clock 128 provides a "read" signal for sampling the data inputs twice per PWM period. Stage 133 is a conventional flip/flop which is triggered by the signal on line 132. The flip/flop provides alternating enables on lines 134 and 137. Line 134 is the enable for the oncoming edge regulator stage 135 and line 137 is the enable for the offgoing edge regulator stage 138. Line 134 is asserted during the first half of the PWM period while line 137 remains low, and line 137 is asserted during the second half of the PWM period while line 134 is low. During the first half of the PWM period while line 134 is high, stage 135 provides a control signal over line 136 to the PWM adjust circuit 130, to adjust the occurrence of the leading edge of a pulse.

The flip/flop 133 remains in its state until the next signal is received over line 132, at which time stage 133 is toggled. This initiates the second half of the PWM period. During this half of the PWM period line 137 is asserted and line 134 is low. The offgoing edge regulator, stage 138 is now enabled. Stage 138 provides a control signal over line 140 to the PWM adjust circuit 130, thus providing a signal on line 131 to adjust the trailing edge of a single pulse.

Each time the controller stage 120 is stimulated by a "read" it provides the resultant output signal on line 141, and this composite data signal is presented to both the oncoming edge regulator 135 and to the offgoing edge regulator 138. However this composite data signal is only used in adjusting one or the other of the two pulse edges, according to which edge regulator (135 or 138) is enabled by the gating signal from flip/flop 133.

FIG. 6 illustrates exemplary waveforms from selected points in the circuitry of FIG. 5 and further illustrates the operation of the disclosed circuitry. Waveform 6A shows the clock signal present on lines 127 and 132. In the illustrated, preferred embodiment these clock signals have a 5 ms. period. The "read inputs" step occurs at each pulse and the calculate duty cycle operation follows.

Waveforms 6B and 6C show the outputs of the toggling flip/flop circuit 133 on lines 134 and 137, respectively. These outputs alternate reset and enable conditions in accordance with the clock signal of waveform 6A.

Waveform 6D shows the output of the oncoming edge regulator 135 on line 136. As can be seen, the output on this line 136 terminates each time that the corresponding enable signal on the line 134 terminates. The $T_{OFF}$ and $T_{ON}$ time periods are shown. These times, together, give the duty cycle as calculated for that enabled period by the controller stage 120 and as communicated to the oncoming edge regulator 135. The duty cycle for this period (one-half the PWM period), thus, is governed by the initiation of the leading edge of the PWM pulse.

Waveform 6E shows the output of the off going edge regulator 138 on line 140. As can be seen, the output on this line 140 initiates each time the corresponding enable signal on the line 137 initiates. The $T_{ON}$ and $T_{OFF}$ time periods are shown. These times, together, give the duty cycle as calculated for that enabled period by the controller stage 120 and as communicated to the off going edge regulator 138. The duty cycle for this period (one-half the PWM period), thus, is governed by the termination of the trailing edge of the PWM pulse.

Waveform 6F shows the PWM adjust signal at the output of the PWM adjust circuit 130 on the line 131. As can be seen, the signal represents the combination of the input signals from lines 136 and 140 (waveforms 6D and 6E, respectively) to this circuit. This waveform 6F provides a PWM control pulse with double-edge modulation. The timing of both the off-to-on transition and the on-to-off transition are controlled by individual duty cycle calculations as explained above. This provides information updating at twice the PWM rate. Yet, the PWM period (10 ms. on the preferred embodiment) remains unchanged.

Referring again to FIG. 5, it is envisioned that the circuits that are shown in block diagram form are readily available to those skilled in the art. For example, controller 120 may be suitably provided by available commercial microprocessors programmed in accordance with the flow chart of FIG. 4. The line 141 may be a digital bus line for providing digital signals for D-to-A processing by edge regulators 135 and 138. Alternately, line 141 may carry triggering analog signals if edge regulators 135 and 138 comprise one-shot type circuits. The PWM adjust circuit 130 may comprise a simple combination circuit, such as a hard-wired OR gate. Any interconnections with other system components are envisioned to be within the skill in the art.

Accordingly, the present invention provides a pulse width modulation technique which may be utilized in a number of control environments, especially continuously variable transmission systems, in which it is desired to increase the sampling rate without increasing the on and off rate of particular physical devices, such as electrohydraulic valves. Thus the sample rate may be increased and, accordingly, the system response time decreased desirably. The present invention also provides a system for desirably implementing the improved method in specific applications, such as a CVT system.

The present invention has been described above in terms of a number of preferred embodiments and the features thereof. Those features of the present invention which are deemed to be novel are set forth with particularity in the appended claims. The example of a modulation technique in a continuously variable transmission system has been given for exemplary purposes only. Such modifications, alterations and other applications of the present invention to other systems as would be apparent to one of ordinary skill in the art and familiar with the teachings of this application are also deemed to fall within the spirit and scope of the present invention. Interconnections between the system of the present invention and other elements for use in a continuously variable transmission or other system and specific program instructions based on the illustrated flow charts also are deemed to be within the ordinary skill of the art.

What is claimed is:

1. A control system for regulating the duty cycle of a pulse train by regulating the oncoming and offgoing edges of each pulse in the train as a function of preselected data, including:
   a pulse width adjust circuit, having a first input connection for receiving a first control signal to determine the timing of the oncoming edge of a given pulse, a second input connection for receiving a second control signal to determine the timing of the offgoing edge of said given pulse, and an output connection for providing the pulse train in accordance with received first and second control signals;
   a duty cycle calculation circuit, having input means for receiving the preselected data and an output connection; and
   a timing circuit, coupled between the output connection of the duty cycle calculation circuit and the input connections of the pulse width adjust circuit, operable to cause the duty cycle calculation circuit to generate a desired duty cycle signal, and to pass the desired duty cycle signal alternately to the first and second input connections of the pulse width adjust circuit, such that the duty cycle signal is calculated and utilized twice in the generation of each pulse in the pulse train.

2. A control system as claimed in claim 1, in which said timing circuit includes:
   an oncoming edge regulator circuit, having an output connection coupled to the first input connection of the pulse width adjust circuit, and having an input connection;
   an offgoing edge regulator circuit, having an output connection coupled to the second input connection of the pulse width adjust circuit, and having an input connection;
   a flip/flop circuit, having a pair of output connections, one coupled to the oncoming edge regulator circuit and the other coupled to the offgoing edge regulator circuit, and having an input connection;
   means coupling the output connection of the duty cycle calculation circuit to the input connections of both edge regulator circuits; and
   timing means, operable to generate a train of timing pulses at a frequency twice the frequency of the output pulse train, and means for passing the timing signals to the duty cycle calculation circuit and to the flip/flop circuit.

3. A system for generating a pulsewidth modulation control signal comprising a train of pulses at a selected frequency in response to selected input parameters comprising:
   clock means for generating clocking signals at twice said selected frequency;
   digital calculation means for calculating a desired duty cycle of a pulse in said control signal in response to said selected input parameters and to said clocking signals;
   pulse generating means coupled to said digital calculation means and said clock means for alternately initiating and terminating a pulse reflecting said duty cycle calculation in said control signal.

4. The system of claim 3 wherein said pulse generating means comprises:
   a first pulse shaping circuit for initiating an output pulse at a time responsive to received duty cycle information from said digital calculation means;
   a second pulse shaping circuit for terminating an output pulse at a time responsive to received duty cycle information from said digital calculation means;
   enabling means coupled to said first and second pulse shaping circuits and responsive to said clock means to alternately enable said first and second pulse shaping circuits, beginning with said first pulse shaping circuit; and
   means for combining the outputs of said first and second pulse shaping circuits as a combined output signal.

5. The system of claim 3 for operation in a continuously variable transmission system for controlling fluid flow wherein said selected input parameters comprise engine speed, line pressure, throttle, belt ratio, clutch pressure and temperature.

* * * * *